(12) United States Patent  
Yanagisawa

(10) Patent No.: US 8,041,159 B2  
(45) Date of Patent: Oct. 18, 2011

(54) OPTICAL/ELECTRICAL HYBRID SUBSTRATE AND METHOD OF MANUFACTURING THE SAME

(75) Inventor: Kenji Yanagisawa, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 82 days.

(21) Appl. No.: 12/358,521

(22) Filed: Jan. 23, 2009

(65) Prior Publication Data

US 2009/0190878 A1 Jul. 30, 2009

(30) Foreign Application Priority Data

Jan. 24, 2008 (JP) ................................. 2008-013752

(51) Int. Cl.  
*G02B 6/12* (2006.01)

(52) U.S. Cl. ........................................................ 385/14

(58) Field of Classification Search .................. None  
See application file for complete search history.

(56) References Cited

U.S. PATENT DOCUMENTS

| | | | |
|---|---|---|---|
| 5,761,350 A * | 6/1998 | Koh ................................. | 385/14 |
| 5,910,706 A * | 6/1999 | Stevens et al. ................. | 313/498 |
| 6,713,788 B2 * | 3/2004 | Duesman et al. ............... | 257/98 |
| 6,741,781 B2 * | 5/2004 | Furuyama ....................... | 385/129 |
| 7,242,828 B2 * | 7/2007 | Oda et al. ........................ | 385/31 |
| 7,481,545 B2 * | 1/2009 | Wang ............................ | 359/871 |
| 7,630,601 B2 * | 12/2009 | Mershon et al. ................ | 385/36 |
| 2003/0113067 A1 * | 6/2003 | Koh et al. ........................ | 385/48 |
| 2003/0142896 A1 * | 7/2003 | Kikuchi et al. ................. | 385/14 |
| 2004/0096152 A1 * | 5/2004 | Nakama et al. ................. | 385/31 |
| 2004/0131302 A1 * | 7/2004 | Kouta et al. ..................... | 385/14 |
| 2004/0264838 A1 * | 12/2004 | Uchida et al. ................... | 385/14 |
| 2006/0239612 A1 * | 10/2006 | De Dobbelaere et al. ...... | 385/37 |
| 2007/0183718 A1 * | 8/2007 | Bae et al. ........................ | 385/47 |

FOREIGN PATENT DOCUMENTS

JP 2000-304953 11/2000

* cited by examiner

*Primary Examiner* — Michelle R Connelly Cushwa  
(74) *Attorney, Agent, or Firm* — Drinker, Biddle & Reath LLP

(57) ABSTRACT

An optical/electrical hybrid substrate is provided. The optical/electrical substrate includes: a wiring substrate; an optical waveguide disposed on the wiring substrate and configured to transmit an optical signal; a mirror support bonded onto the wiring substrate with an adhesive and being made of glass or silicon; and a mirror which reflects the optical signal and which is formed on an inclined surface of the mirror support.

10 Claims, 17 Drawing Sheets

OPTICAL/ELECTRICAL HYBRID SUBSTRATE AND METHOD OF MANUFACTURING THE SAME

This application is based on and claims priority from Japanese Patent Application No. 2008-013752, filed on Jan. 24, 2008, the entire contents of which are hereby incorporated by reference.

BACKGROUND

1. Technical Field

The present disclosure relates to an optical/electrical hybrid substrate and its manufacturing method. More particularly, the disclosure relates to an optical/electrical hybrid substrate which includes a wiring substrate, an optical waveguide disposed on the wiring substrate, and a mirror for reflecting an optical signal, as well as to its manufacturing method.

2. Related Art

In recent years, with the increase in the speed of the information communication, light has come to be used as an information communication medium in place of an electrical signal. In such an optical communication field, it is necessary to convert an optical signal into an electrical signal and vice versa and to perform various kinds of processing such as modulation on light. To meet this requirement, optical/electrical hybrid substrates for such conversion processing are being developed.

FIG. 1 is a sectional view of the related-art optical/electrical hybrid substrate.

Referring to FIG. 1, the related-art optical/electrical hybrid substrate 200 includes a wiring substrate 201, an optical waveguide 202, mirrors 203 and 204, cladding members 206, an adhesive 207, a light-emitting element 208, a light-receiving element 209, and underfill resins 211 and 212.

The wiring substrate 201 includes a core substrate 215, through vias 216, upper traces 218, solder resist layers 219 and 223, solders 221, and lower traces 222.

The through vias 216 are provided to penetrate through the core substrate 215. The upper traces 218 are formed on a top surface 215A of the core substrate 215 and a top surface of the through vias 216. The top traces 218 have connection surfaces 218A to which a terminal 236 of the light-emitting element 208 and a terminal 238 of the light-receiving element 209 are connected. The solder resist layer 219 is formed on the top surface 215A of the core substrate 215 so as to cover parts of the top traces 218. The solder resist layer 219 has openings 219A through which the connection surfaces 218A are exposed when the openings 219A are not filled up. The solders 221 are formed in the openings 219A. The solders 221 serve to fix the terminal 236 of the light emitting element 208 and the terminal 238 of the light-receiving element 209 to the respective top traces 218.

The lower traces 222 are formed on a bottom surface 215B of the core substrate 215 and the bottom surface of the through vias 216. The lower traces 222 are electrically connected to the top traces 218 via the through vias 216, respectively. The lower traces 222 have connection surfaces 222A on which external connection terminals (not shown) are formed. The solder resist layer 223 is formed on the bottom surface 215B of the core substrate 215 so as to cover parts of the bottom traces 222. The solder resist layer 223 has openings 223A through which the connection surfaces 222A are exposed.

The optical waveguide 202 has a first cladding layer 226, a core 227, and a second cladding layer 228. The core 227, which serves to transmit an optical signal, is formed on the first cladding layer 226. The core 227 is made of a material having a larger refractive index than the first cladding layer 226 and the second cladding layer 228. The second cladding layer 228 is formed over the first cladding layer 226 so as to cover the core 227. The optical waveguide 202 has grooves 231 and 232 through which the core 227 is exposed when the grooves 231 and 232 are not filled up. The groove 231 is a V-shaped groove and has a inclined surface 231A on which the mirror 203 is formed. The inclined surface 231A is inclined so as to form a certain angle (45°, for example) with the top surface of the solder resist layer 219. The groove 232 is a V-shaped groove and has a inclined surface 232A on which the mirror 204 is formed. The inclined surface 232A is inclined so as to form a certain angle (45°, for example) with the top surface of the solder resist layer 219. The cladding members 206 fill the grooves 231 and 232 in which the mirrors 203 and 204 are formed, respectively.

The optical waveguide 202 in which the mirrors 203 and 204 and the cladding members 206 are formed is bonded to the top surface of the solder resist layer 219 with the adhesive 207.

The light-emitting element 208 has a light-emitting portion 235 and the terminal 236. The light-emitting element 208 is disposed on the wiring substrate 201 in such a manner that the light-emitting portion 235 is opposed to that part of the mirror 203 which is located in the core 227. The terminal 236 is formed on the connection surface 218A of the left-hand top trace 218. The terminal 236 is fixed to the left-hand top trace 218 with the solder 221.

The light-receiving element 209 has a light-receiving portion 237 and the terminal 238. The light-receiving element 209 is disposed on the wiring substrate 201 in such a manner that the light-receiving portion 237 is opposed to that part of the mirror 204 which is located in the core 227. The terminal 238 is formed on the connection surface 218A of the right-hand top trace 218. The terminal 238 is fixed to the right-hand top trace 218 with the solder 221.

The underfill resin 211 is formed so as to fill the space between the light-emitting element 208 and each of the wiring substrate 201 and the optical waveguide 202. The underfill resin 212 is formed so as to fill the space between the light-receiving element 209 and each of the wiring substrate 201 and the optical waveguide 202. The underfill resins 211 and 212 are made of an optically transparent resin.

FIGS. 2-8 show a manufacturing process of the above-described related-art optical/electrical hybrid substrate 200.

The manufacturing method of the related-art optical/electrical hybrid substrate 200 will be described below with reference to FIGS. 2-8. First, in a step of FIG. 2, a wiring substrate 201 is formed by a known method. Then, in a step of FIG. 3, a core 227 and a second cladding layer 228 are placed on a first cladding layer 226 in this order.

Then, in a step of FIG. 4, a groove 231 having a inclined surface 231A and a groove 232 having a inclined surface 232A are formed by processing the structure of FIG. 3 with a dicer. Then, in a step of FIG. 5, mirrors 203 and 204 are formed by forming metal films on the inclined surfaces 231A and 232A, respectively.

Then, in a step of FIG. 6, the groove 231 formed with the mirror 203 and the groove 232 formed with the mirror 204 are filled with respective cladding members 206. Then, in a step of FIG. 7, the optical waveguide 202 (the structure of FIG. 6) which is formed with the mirrors 203 and 204 and the cladding members 206 is bonded to the top surface of the solder resist layer 219 of the wiring substrate 201 shown in FIG. 2.

Subsequently, in a step of FIG. 8, the solders 221 are melted, a terminal 236 of a light-emitting element 208 and a terminal 238 of a light-receiving element 209 are fixed to the connection surfaces 218A of the upper traces 218, respectively, and underfill resins 211 and 212 are formed. The optical/electrical hybrid substrate 200 is thus completed (see e.g., JP-A-2000-304953).

As described above, in the related-art optical/electrical hybrid substrate 200, the grooves 231 and 232 in which the mirrors 203 and 204 are to be formed are formed in the optical waveguide 202 and then the mirrors 203 and 204 are formed on the inclined surfaces 231A and 232A of the grooves 231 and 232.

However, there is a problem in that it is difficult to form, with high accuracy, the inclined surfaces 231A and 232A at the certain angle (45°, for example) in the optical waveguide 202 in which the core 227 and the second cladding layer 228 are formed on the first cladding layer 226 in this order. This results in a problem that when an optical signal is transmitted via the mirrors 203 and 204 which are formed on the inclined surfaces 231A and 232A of the grooves 231 and 232, the optical signal suffers a large transmission loss.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of the present invention to provide an optical/electrical hybrid substrate and its manufacturing method, which can reduce the transmission loss of an optical signal that is caused by a mirror.

According to one or more aspects of the present invention, an optical/electrical hybrid substrate is provided. The optical/electrical substrate includes: a wiring substrate; an optical waveguide disposed on the wiring substrate and configured to transmit an optical signal; a mirror support bonded onto the wiring substrate with an adhesive and being made of glass or silicon; and a mirror which reflects the optical signal and which is formed on an inclined surface of the mirror support.

According to one or more aspects of the present invention, the adhesive is a thermosetting resin or an ultraviolet-setting resin.

According to one or more aspects of the present invention, an angle between the inclined surface and a surface of the wiring substrate onto which the mirror support is bonded is about 45 degree.

According to one or more aspects of the present invention, there is provided a method of manufacturing an optical/electrical hybrid substrate. The method includes: (a) forming a wiring substrate; (b) forming an optical waveguide; (c) forming a mirror support having an inclined surface; (d) forming a mirror on the inclined surface of the mirror support; and (e) bonding the mirror support formed with the mirror onto the wiring substrate with an adhesive.

According to one or more aspects of the present invention, the method further includes: (f) bonding the optical waveguide to the wiring substrate such that the optical waveguide is opposed to a reflection surface of the mirror which reflects an optical signal.

According to one or more aspects of the present invention, the mirror support is made of glass and the adhesive is an ultraviolet-setting resin, and step (e) includes: bonding the mirror support onto the wiring substrate by irradiating the adhesive with ultraviolet light.

According to one or more aspects of the present invention, an angle between the inclined surface and a surface of the wiring substrate onto which the mirror support is bonded is about 45 degree.

Other aspects and advantages of the invention will be apparent from the following description, the drawings and the claims.

DETAILED DESCRIPTION OF EXEMPLARY EMBODIMENTS OF THE INVENTION

Exemplary, embodiments of the present invention will be now described with reference to the drawings.

First Embodiment

Figure 1:
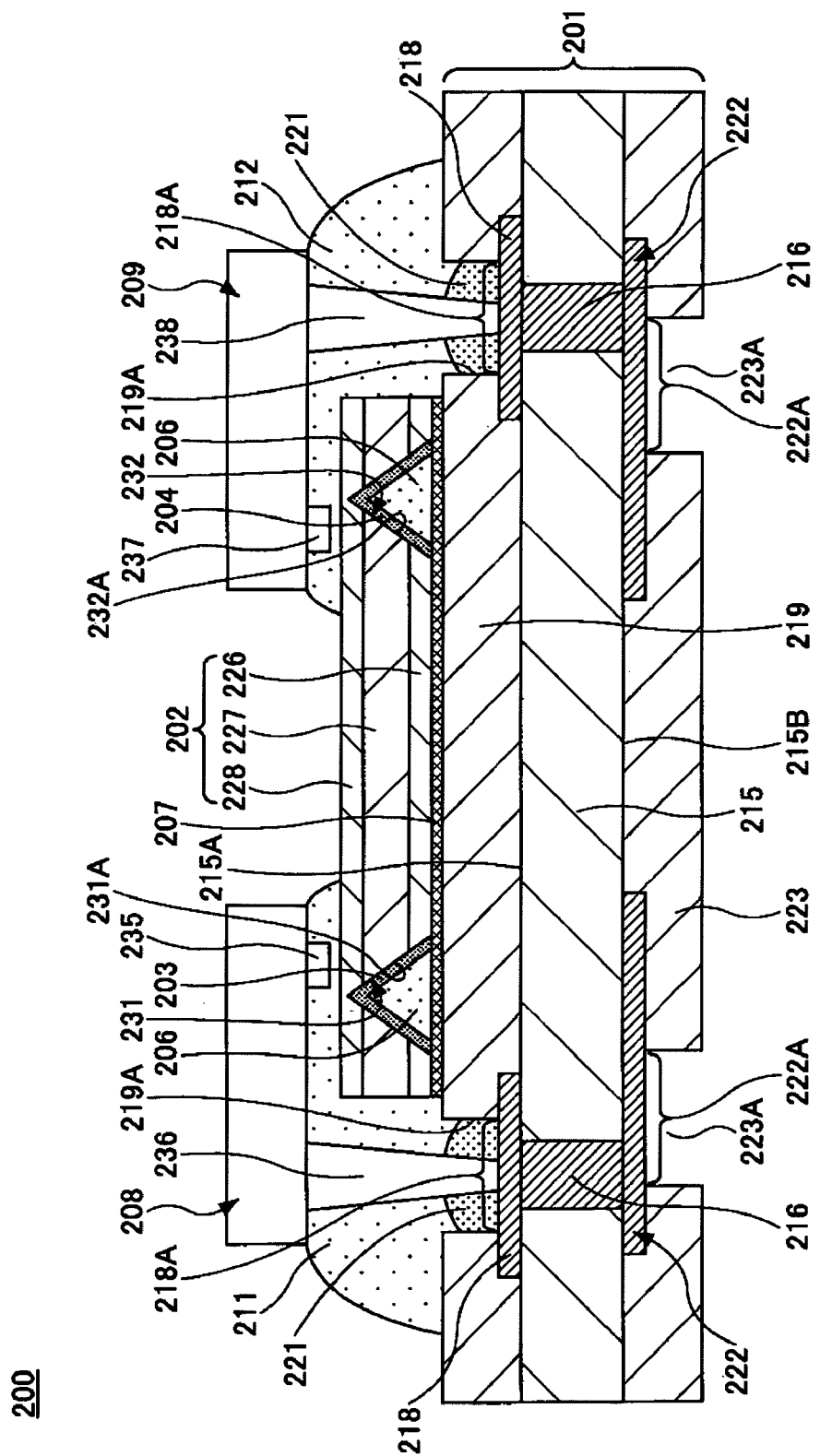
FIG. 1 is a sectional view of the related-art optical/electrical hybrid substrate.
Figure 2:
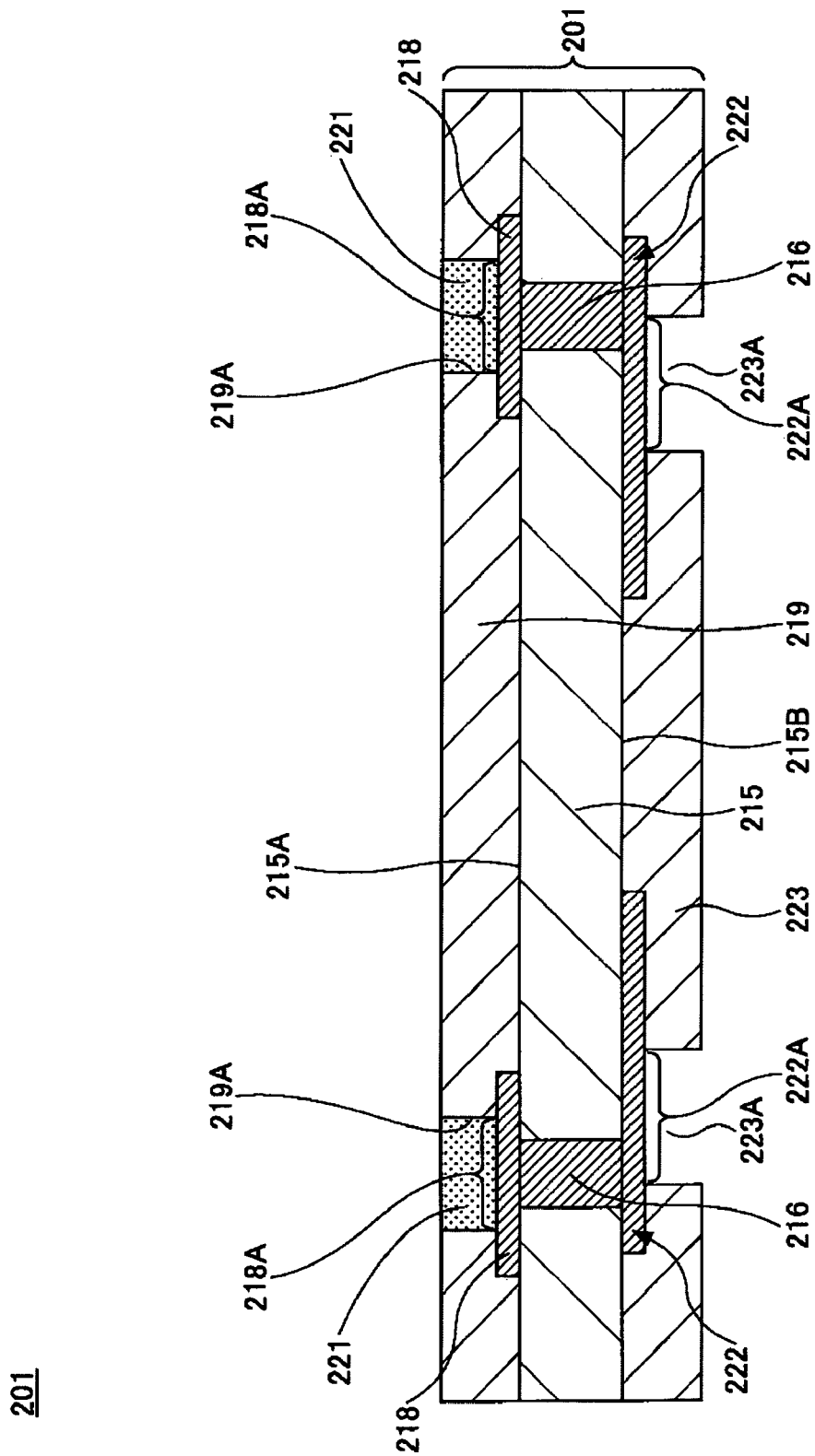
FIG. 2 is a view (#1) showing a manufacturing process of the related-art optical/electrical hybrid substrate.
Figure 3:
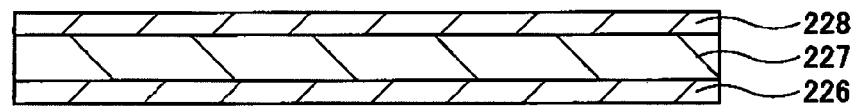
FIG. 3 is a view (#2) showing the manufacturing process of the related-art optical/electrical hybrid substrate.
Figure 4:
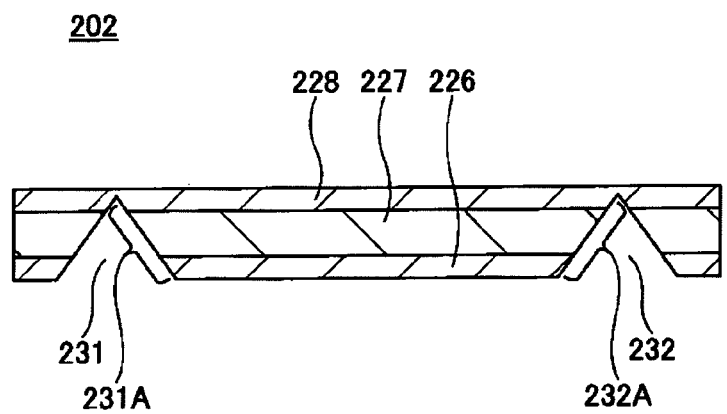
FIG. 4 is a view (#3) showing the manufacturing process of the related-art optical/electrical hybrid substrate.
Figure 5:
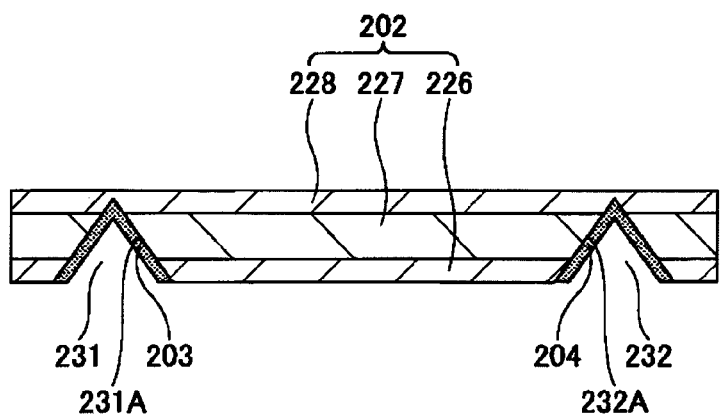
FIG. 5 is a view (#4) showing the manufacturing process of the related-art optical/electrical hybrid substrate.
Figure 6:
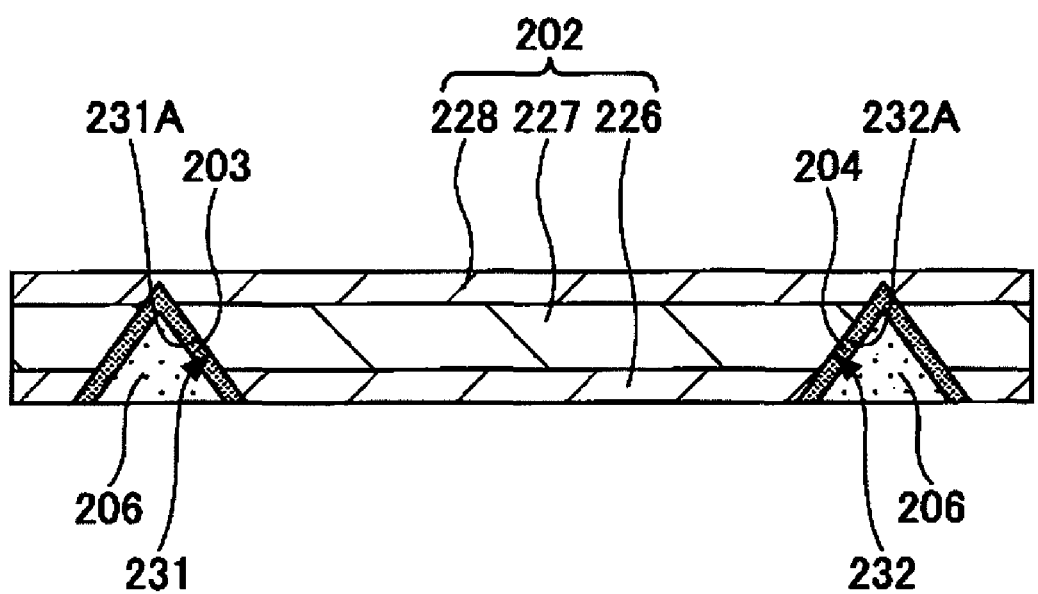
FIG. 6 is a view (#5) showing the manufacturing process of the related-art optical/electrical hybrid substrate.
Figure 7:
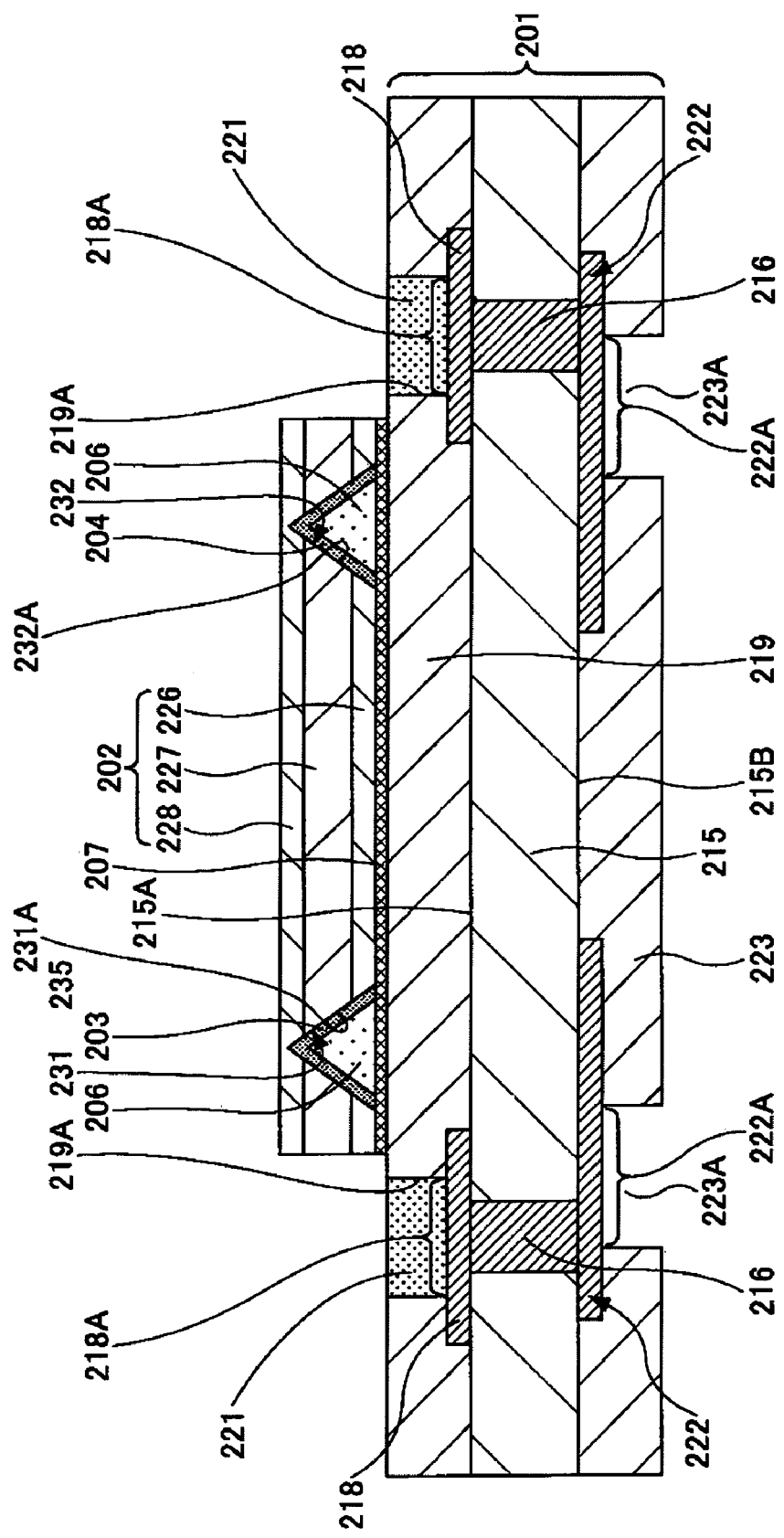
FIG. 7 is a view (#6) showing the manufacturing process of the related-art optical/electrical hybrid substrate.
Figure 8:
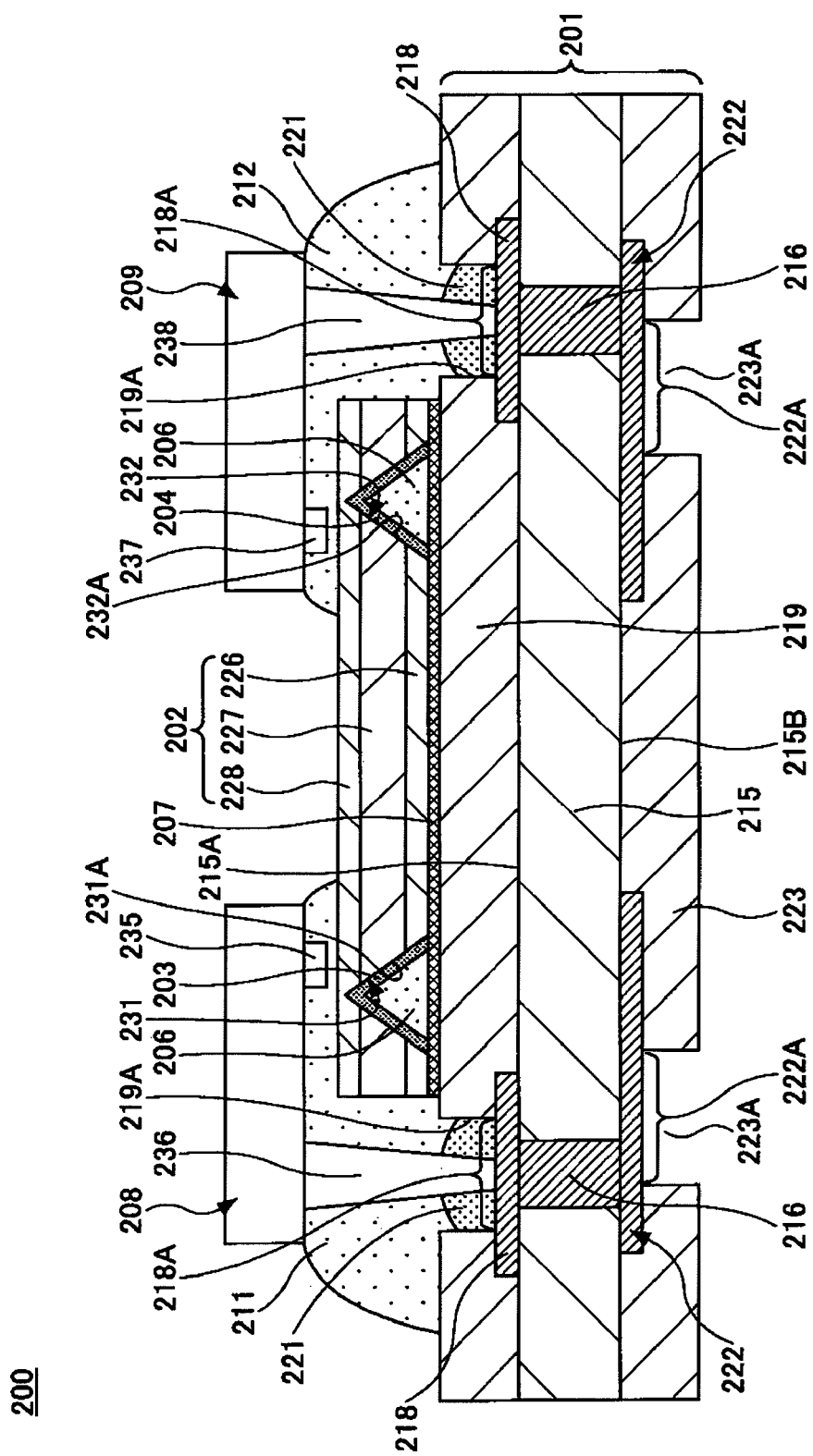
FIG. 8 is a view (#7) showing the manufacturing process of the related-art optical/electrical hybrid substrate.
Figure 9:
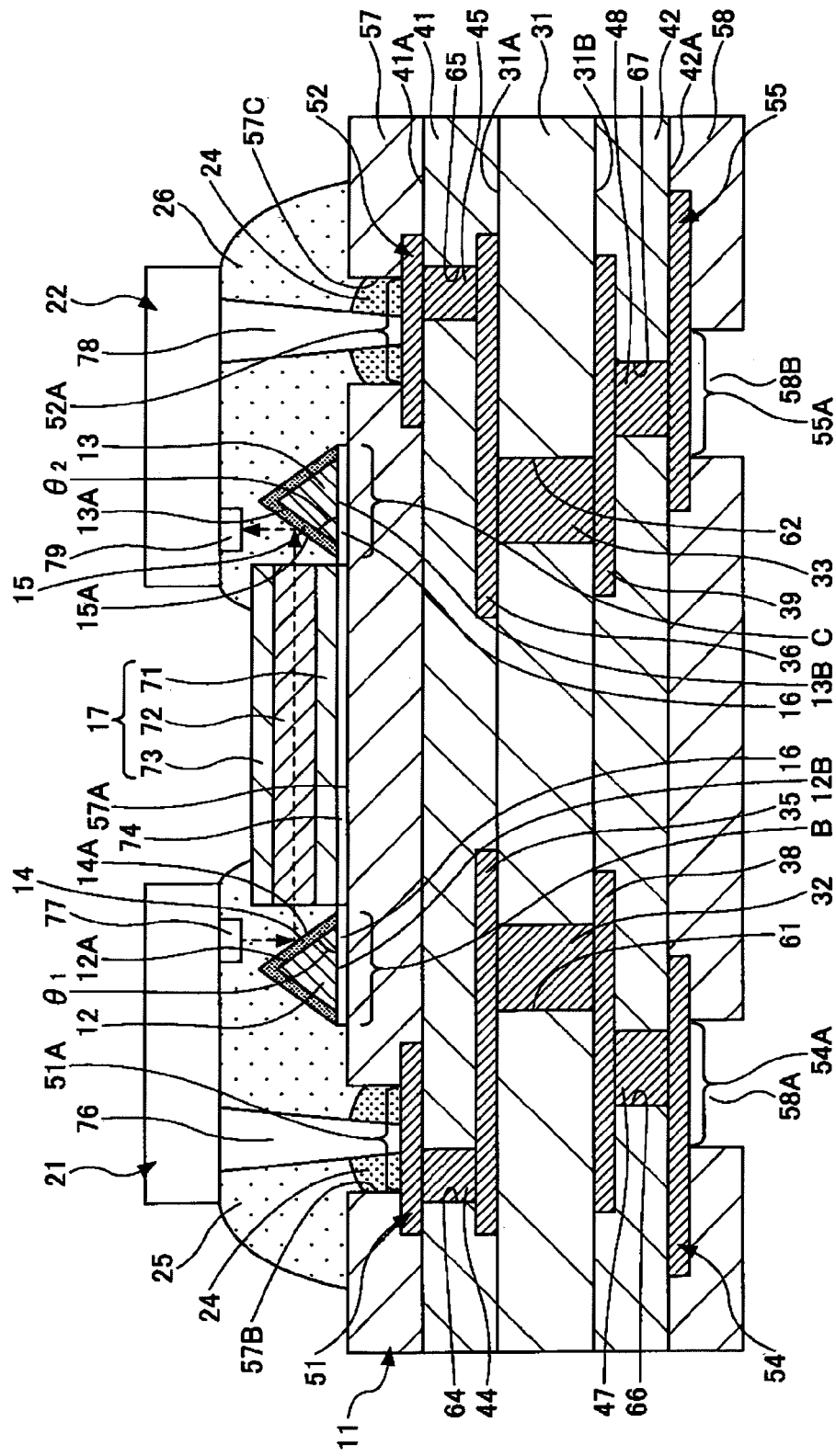
FIG. 9 is a sectional view of an optical/electrical hybrid substrate according to a first embodiment of the present invention.

FIG. 9 is a sectional view of an optical/electrical hybrid substrate according to a first embodiment of the present invention.

Referring to FIG. 9, the optical/electrical hybrid substrate 10 according to the first embodiment includes a wiring substrate 11, mirror supports 12 and 13, mirrors 14 and 15, an optical waveguide 17, a light-emitting element 21, a light-receiving element 22, solders 24, and underfill resins 25 and 26.

The wiring substrate 11, which is a build-up substrate with a core, includes a core substrate 31, through vias 32 and 33, traces 35, 36, 38, and 39, insulating layers 41 and 42, vias 44, 45, 47, and 48, wiring patterns 51, 52, 54, and 55, solder resist layers 57 and 58, and solders 221.

The core substrate 31 is of a plate-like and has through holes 61 and 62. The through via 32 is formed by using the through-hole 61. The top of the through vias 32 is connected to the trace 35 and the bottom of the through via 32 is connected to the trace 38. The through via 33 is formed by using the through-hole 62. The top of the through vias 33 is connected to the trace 36 and the bottom of the through via 33 is connected to the trace 39. The through vias 32 and 33 may be formed with Cu, for example.

The trace 35 is formed on a top surface 31A of the core substrate 31 and the top surface of the through via 32. The trace 35 is connected to the through via 32. The trace 36 is formed on the top surface 31A of the core substrate 31 and the top surface of the through via 33. The trace 36 is connected to the through via 33.

The trace 38 is formed on a bottom surface 31B of the core substrate 31 and the bottom surface of the through via 32. The trace 38 is connected to the through via 32 and electrically connected to the trace 35 via the through via 32.

The trace 39 is formed on the bottom surface 31B of the core substrate 31 and the bottom surface of the through via 33. The trace 39 is connected to the through via 33 and electrically connected to the trace 36 via the through via 33. The traces 35, 36, 38, and 39 may be made of Cu, for example.

The insulating layer 41 is formed on the top surface 31A of the core substrate 31 so as to cover the traces 35 and 36. The insulating layer 41 has openings 64 and 65 through which part of the trace 35 and part of the trace 36 are exposed, respectively, when the openings 64 and 65 are not filled up. The insulating layer 42 is formed on the bottom surface 31B of the core substrate 31 so as to cover the traces 38 and 39. The insulating layer 42 has openings 66 and 67 through which part of the trace 38 and part of the trace 39 are exposed, respectively, when the openings 66 and 67 are not filled up.

The via 44 is formed by using the opening 64. The bottom of the via 44 is connected to the trace 35 and the top surface of the via 44 is approximately flush with a top surface 41A of the insulating layer 41. The via 45 is formed by using the opening 65. The bottom of the via 45 is connected to the trace 36 and the top surface of the via 45 is approximately flush with the top surface 41A of the insulating layer 41.

The via 47 is formed by using the opening 66. The top of the via 47 is connected to the trace 38 and the bottom surface of the via 47 is approximately flush with a bottom surface 42A of the insulating layer 42. The via 48 is formed by using the opening 67. The top of the via 48 is connected to the trace 39 and the bottom surface of the via 48 is approximately flush with the bottom surface 42A of the insulating layer 42.

The wiring pattern 51 is formed on the top surface 41A of the insulating layer 41 and the top surface of the via 44. As a result, the wiring pattern 51 is connected to the via 44 and electrically connected to the trace 35 via the via 44. The wiring pattern 51 has a connection portion 51A to which a terminal 76 of the light-emitting element 21 is to be connected.

The wiring pattern 52 is formed on the top surface 41A of the insulating layer 41 and the top surface of the via 45. As a result, the wiring pattern 52 is connected to the via 45 and electrically connected to the trace 36 via the via 45. The wiring pattern 52 has a connection portion 52A to which a terminal 78 of the light-receiving element 22 is to be connected.

The wiring pattern 54 is formed on the bottom surface 42A of the insulating layer 42 and the bottom surface of the via 47. As a result, the wiring pattern 54 is connected to the via 47 and electrically connected to the trace 38 via the via 47. The wiring pattern 54 has a connection portion 54A to which an external connection terminal (not shown) is to be connected.

The wiring pattern 55 is formed on the bottom surface 42A of the insulating layer 42 and the bottom surface of the via 48. As a result, the wiring pattern 55 is connected to the via 48 and electrically connected to the trace 39 via the via 48. The wiring pattern 55 has a connection portion 55A to which an external connection terminal (not shown) is to be connected.

The solder resist layer 57 is formed on the top surface 41A of the insulating layer 41 so as to cover the wiring patterns 51 excluding the connection portions 51A and 52A. The solder resist layer 57 has openings 57B and 57C through which the connection portions 51A and 52A are exposed, respectively when the openings 57B and 57C are not filled up. Those portions of the top surface 57A of the solder resist layer 57, which are located in bonding area B and C for the mirror supports 12 and 13, are flat surfaces.

The solder resist layer 58 is formed on the bottom surface 42A of the insulating layer 42 so as to cover the wiring patterns 54 excluding the connection portions 54A and 55A. The solder resist layer 58 has openings 58A and 58B through which the connection portions 54A and 55A are exposed, respectively.

The mirror support 12 is a member that is used for formation of the mirror 14 and is separate from the wiring substrate 11 and the optical waveguide 17. That is, the mirror support 12 is a member that is formed by a manufacturing step that is different from manufacturing steps of the wiring substrate 11 and the optical waveguide 17. The mirror support 12 has a inclined surface 12A on which the mirror 14 is formed. The inclined surface 12A is a smooth surface. The angle $\theta_1$ formed by the inclined surface 12A and the top surface 57A of the solder resist layer 57 is set at a certain angle that allows the mirror 14 to reflect an optical signal coming from the light-emitting element 21 toward a core 72. The angle $\theta_1$ may be set at 45°, for example.

Since as described above the mirror support 12 is separate from the wiring substrate 11 and the optical waveguide 17, the inclined surface 12A of the mirror support 12 on which the mirror 14 is formed can be made a smooth surface. As a result, a reflection surface 14A of the mirror 14 for reflecting an optical signal can be made a smooth surface, whereby the transmission loss of an optical signal caused by the mirror 14 can be reduced. In addition, the inclined surface 12A can be formed with high accuracy so that the angle $\theta_1$ between the inclined surface 12A and the top surface 57A of the solder resist layer 57 becomes equal to the certain angle (e.g., 45°).

A bonding surface 12B (to be in contact with an adhesive 16) of the mirror support 12 is a flat surface. The mirror support 12 on which of inclined surface 12A the mirror 14 is formed is bonded, with the adhesive 16, to that portion of the top surface 57A of the solder resist layer 57 which is located in the bonding area B. That portion of the top surface 57A of the solder resist layer 57, which is located in the bonding area B, is a flat surface.

Since as described above that portion of the top surface 57A of the solder resist layer 57, which is located in the bonding area B, is a flat surface and the bonding surface 12B of the mirror support 12 is a flat surface, the mirror 14 can efficiently reflect, toward the core 72, an optical signal emitted from the light-emitting element 21. As a result, the transmission loss of an optical signal at the boundary between the mirror 14 and the optical waveguide 17 can be reduced.

For example, the mirror support 12 may be made of silicon (specifically, it may be a silicon substrate, for example) or glass. Where the mirror support 12 is made of silicon, the adhesive 16 may be a thermosetting resin, for example. Where the mirror support 12 is made of glass, the adhesive 16 may be an ultraviolet-setting resin, for example. The ultraviolet-setting resin may be an epoxy resin, an acrylic resin, or the like.

The mirror support 13 is a member that is used for formation of the mirror 15 and is separate from the wiring substrate 11 and the optical waveguide 17. That is, the mirror support 13 is a member that is formed by a manufacturing step that is different from manufacturing steps of the wiring substrate 11 and the optical waveguide 17. The mirror support 13 has a inclined surface 13A on which the mirror 15 is formed. The inclined surface 13A is a smooth surface. The angle $\theta_2$ formed by the inclined surface 13A and the top surface 57A of the solder resist layer 57 is set at a certain angle that allows the mirror 15 to reflect, toward a light-receiving portion 79 of the light-receiving element 22, an optical signal transmitted by the core 72 of the optical waveguide 17. The angle $\theta_2$ may be set at 45°, for example.

Since as described above the mirror support 13 is separate from the wiring substrate 11 and the optical waveguide 17, the inclined surface 13A of the mirror support 13 on which the mirror 15 is formed can be made a smooth surface. As a result, a reflection surface 15A of the mirror 15 for reflecting an optical signal can be made a smooth surface, whereby the transmission loss of an optical signal caused by the mirror 15 can be reduced. In addition, the inclined surface 13A can be formed with high accuracy so that the angle $\theta_2$ between the inclined surface 13A and the top surface 57A of the solder resist layer 57 becomes equal to the certain angle (e.g., 45°).

A bonding surface 13B (to be in contact with an adhesive 16) of the mirror support 13 is a flat surface. The mirror support 13 on which of inclined surface 13A the mirror 15 is formed is bonded, with the adhesive 16, to that portion of the top surface 57A of the solder resist layer 57 which is located in the bonding area C. That portion of the top surface 57A of the solder resist layer 57, which is located in the bonding area C, is a flat surface.

Since as described above that portion of the top surface 57A of the solder resist layer 57, which is located in the bonding area C, is a flat surface and the bonding surface 13B of the mirror support 13 is a flat surface, the mirror 15 can efficiently reflect an optical signal transmitted by the core 72 of the optical waveguide 17 toward the light-receiving portion 79 of the light-receiving element 22. Thus, the transmission loss of an optical signal at the boundary between the mirror 15 and the optical waveguide 17 can be reduced.

For example, the mirror support 13 may be made of silicon (specifically, it may be a silicon substrate, for example) or glass. Where the mirror support 13 is made of silicon, the adhesive 16 may be a thermosetting resin, for example. Where the mirror support 13 is made of glass, the adhesive 16 may be an ultraviolet-setting resin, for example. The ultraviolet-setting resin may be an epoxy resin, an acrylic resin, or the like.

The mirror 14 is formed on the inclined surface 12A of the mirror support 12. The mirror 14 is configured to reflect an optical signal emitted from the light-emitting element 21 toward the core 72 of the optical waveguide 17. For example, the mirror 14 may be formed by a metal film such as an Au film. Where the mirror 14 is formed by an Au film, the thickness of the mirror 14 may be 0.2 to 1.0 μm, for example.

The mirror 15 is formed on the inclined surface 13A of the mirror support 13. The mirror 15 is configured to reflect an optical signal transmitted by the core 72 of the optical waveguide 17 toward the light-receiving portion 79 of the light-receiving element 22. For example, the mirror 15 may be formed by a metal film such as an Au film. Where the mirror 15 is formed by an Au film, the thickness of the mirror 15 may be 0.2 to 1.0 μm, for example.

Figure 10:
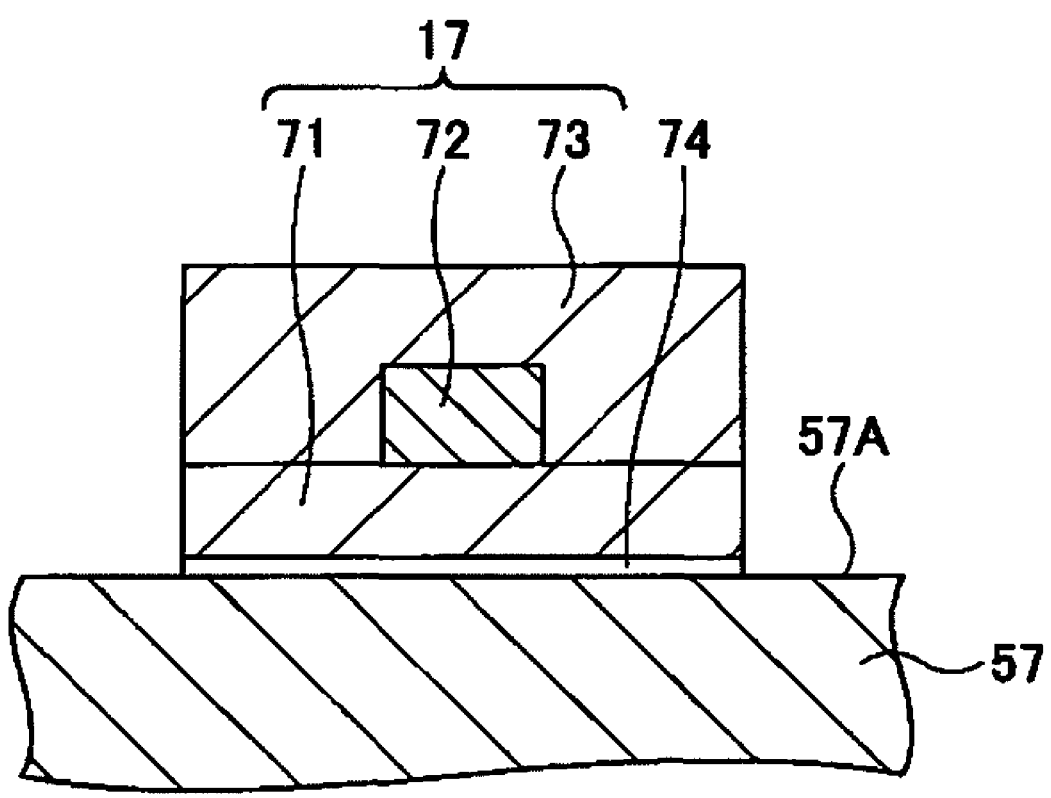
FIG. 10 is a sectional view of the optical waveguide shown in FIG. 9.
Figure 11:
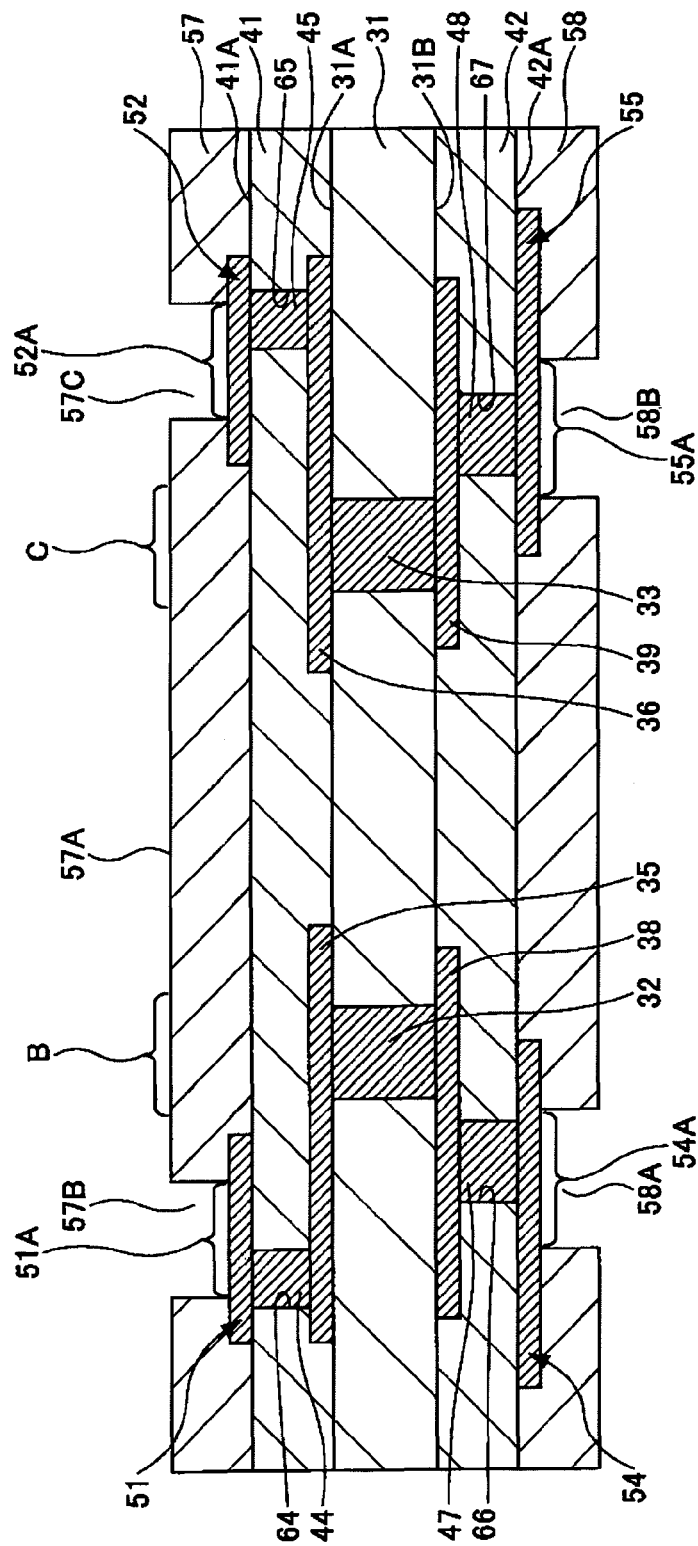
FIG. 11 is a view (#1) showing a manufacturing process of the optical/electrical hybrid substrate according to the first embodiment of the present invention.

FIG. 10 is a sectional view of the optical waveguide 17 shown in FIG. 9.

Referring to FIGS. 9 and 10, the optical waveguide 17 is formed to be separate from the wiring substrate 11 and the mirror supports 12 and 13 and is bonded to that portion of the top surface 57A of the solder resist layer 57 which is located between the bonding area B and C. The optical waveguide 17 includes a first cladding layer 71, the core 72, and a second cladding layer 73. The core 72 and the second cladding layer 73 are provided on the first cladding layer 71 in this order. The first cladding layer 71 is bonded, with an adhesive 74, to that portion of the top surface 57A of the solder resist layer 57 which is located between the bonding area B and C. The core 72, which is formed on the first cladding layer 71, is configured to transmit an optical signal. The core 72 is made of a material having a larger refractive index than the first cladding layer 71 and the second cladding layer 73. The second cladding layer 73 is formed over the first cladding layer 71 so as to cover the core 72.

The light-emitting element 21 is disposed over the mirror 14 and the connection portion 51A. The light-emitting element 21 has a terminal 76 and a light-emitting portion 77. The bottom of the terminal 76 is fixed to the connection portion 51A with a solder 24. The light-emitting element 21 is electrically connected to the connection portion 51A via the terminal 76. The light-emitting portion 77 is configured to send an optical signal. The light-emitting portion 77 is placed at such a position so as to apply an optical signal to the reflection surface 14A of the mirror 14. The light-emitting element 21 may be a vertical cavity surface emitting laser (VCSEL), for example.

The light-receiving element 22 is disposed over the mirror 15 and the connection portion 52A. The light-receiving element 22 has a terminal 78 and the light-receiving portion 79. The bottom of the terminal 78 is fixed to the connection portion 52A with a solder 24. The light-receiving element 22 is electrically connected to the connection portion 52A via the terminal 78. The light-receiving portion 79 is configured to receive an optical signal. The light-receiving portion 79 is placed at such a position so as to receive an optical signal that is reflected by the mirror 15. The light-receiving portion 79 may be a photodiode (PD), for example.

The solders 24 are formed on the respective connection portions 51A and 52A. The solders 24 serve to fix the terminals 76 and 78 to the connection portions 51A and 52A, respectively.

The underfill resin 25 is formed so as to fill the space between the light-emitting element 21 and each of the wiring substrate 11, the mirror 14, and the optical waveguide 17. The underfill resin 25 is a resin for fixing the light-emitting element 21 to the wiring substrate 11 firmly. For example, the underfill resin 25 is made of an optically transparent resin capable of transmitting an optical signal.

The underfill resin 26 is formed so as to fill the space between the light-receiving element 22 and each of the wiring substrate 11, the mirror 15, and the optical waveguide 17. The underfill resin 26 is a resin for fixing the light-receiving element 22 to the wiring substrate 11 firmly. For example, the underfill resin 26 is made of an optically transparent resin capable of transmitting an optical signal.

In the optical/electrical hybrid substrate according to the exemplary embodiment, the mirror supports 12 and 13 are provided to be separate from the wiring substrate 11 and the optical waveguide 17, whereby the inclined surfaces 12A and 13A of the mirror supports 12 and 13 on which the mirrors 14 and 15 are formed, respectively, can be made smooth surfaces. As a result, the reflection surfaces 14A and 15A of the mirrors 14 and 15 for reflecting an optical signal can be made smooth surfaces. Thus, the transmission loss of an optical signal caused by the mirrors 14 and 15 can be reduced.

FIGS. 11-18 show a manufacturing process of the above-described optical/electrical hybrid substrate 10 according to the first embodiment of the present invention.

The manufacturing method of the optical/electrical hybrid substrate 10 according to the first embodiment will be described below with reference to FIGS. 11-18. First, in a step of FIG. 11, a wiring substrate 11 is manufactured by a known method (wiring substrate forming step). In this step, a solder resist layer 57 is formed so that those portions of a top surface 57A of the solder resist layer 57, which are located in bonding area B and C, become flat surfaces, respectively.

Figure 12:
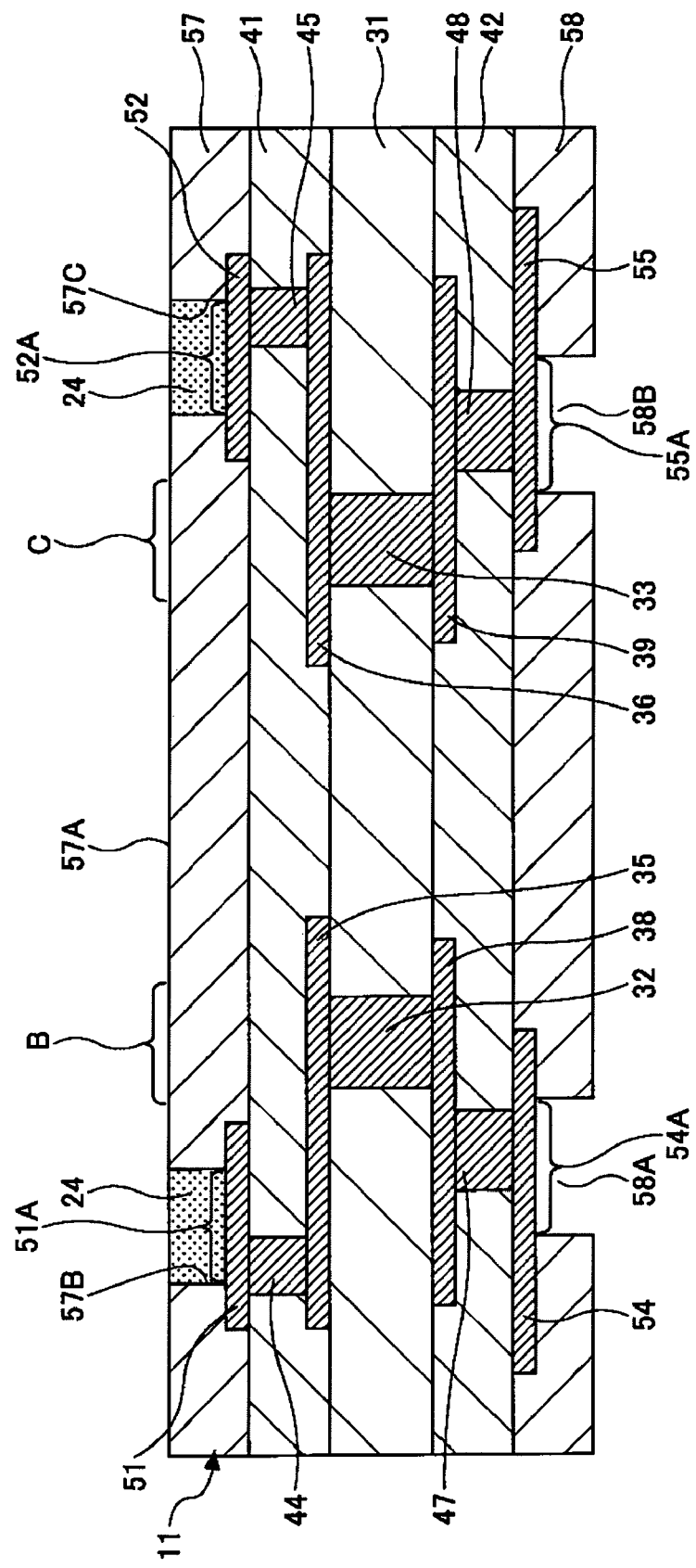
FIG. 12 is a view (#2) showing a manufacturing process of the optical/electrical hybrid substrate according to the first embodiment of the present invention.
Figure 13:
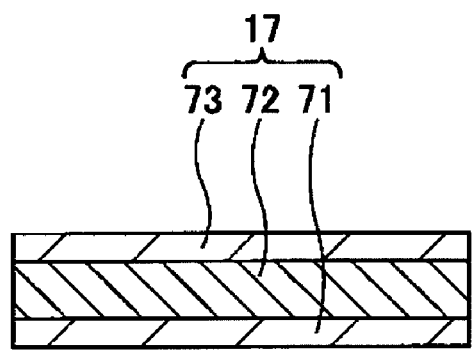
FIG. 13 is a view (#3) showing a manufacturing process of the optical/electrical hybrid substrate according to the first embodiment of the present invention.

Then, in a step of FIG. 12, solders 24 are formed on connection portions 51A and 52A that are exposed through openings 57B and 57C of the solder resist layer 57, respectively. Then, in a step of FIG. 13, a core 72 and a second cladding layer 73 are provided on a first cladding layer 71 in this order by a known method (optical waveguide forming step).

Figure 14:
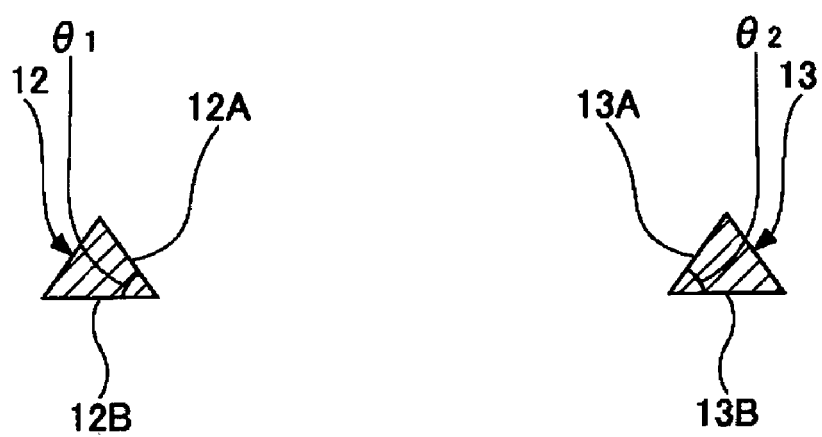
FIG. 14 is a view (#4) showing a manufacturing process of the optical/electrical hybrid substrate according to the first embodiment of the present invention.

Then, in a step of FIG. 14, a mirror support 12 having a inclined surface 12A on which a mirror 14 is to be formed and a mirror support 13 having a inclined surface 13A on which a mirror 15 is to be formed are formed (mirror support forming step). In this step, the mirror supports 12 and 13 are formed so that the inclined surfaces 12A and 13A of the mirror supports 12 and 13 become smooth surfaces.

The mirror supports 12 and 13 having the smooth inclined surfaces 12A and 13A are formed in this manner in the manufacturing step which is separate from the optical waveguide forming step, and then the mirrors 14 and 15 are formed on the smooth inclined surfaces 12A and 13A of the mirror supports 12 and 13. As a result, reflection surfaces 14A and 15A of the mirrors 14 and 15 for reflecting an optical signal can be made smooth surfaces. The transmission loss of an optical signal caused by the mirrors 14 and 15 can thus be reduced.

The mirror supports 12 and 13 may be made of silicon, glass, or the like. Where the mirror supports 12 and 13 are made of silicon, they are formed by, for example, etching a silicon substrate. Where the mirror supports 12 and 13 are made of glass, they are formed by, for example, pouring molten glass into dies that conform, in shape, to the mirror supports 12 and 13 and then cooling the dies that are filled with the glass. The smooth inclined surfaces 12A and 13A are formed by, for example, polishing those portions of the mirror supports 12 and 13 which correspond to the inclined surfaces 12A and 13A, respectively.

In the mirror support forming step, the mirror supports 12 and 13 are formed so that bonding surfaces 12B and 13B of the mirror supports 12 and 13 become flat surfaces, respectively.

The bonding surface 12B of the mirror support 12 is made a flat surface in this manner and, as described above, that portion of the top surface 57A of the solder resist layer 57, which is located in the bonding area B, is made a flat surface. As a result, the mirror 14 which is formed on the inclined surface 12A can efficiently reflect an optical signal emitted from the light-emitting element 21 toward the core 72 of the optical waveguide 17. The transmission loss of an optical signal at the boundary between the mirror 14 and the optical waveguide 17 can thus be reduced.

The bonding surface 13B of the mirror support 13 is made a flat surface and that portion of the top surface 57A of the solder resist layer 57, which is located in the bonding area C, is made a flat surface. As a result, the mirror 15 which is formed on the inclined surface 13A can efficiently reflect an optical signal transmitted by the core 72 of the optical waveguide 17 toward a light-receiving portion 79 of a light-receiving element 22. The transmission loss of an optical signal at the boundary between the mirror 15 and the optical waveguide 17 can thus be reduced.

The angle $\theta_1$ formed by the inclined surface 12A on which the mirror 14 is formed and the bonding surface 12B may be set at 45°, for example. The angle $\theta_2$ formed by the inclined surface 13A on which the mirror 15 is formed and the bonding surface 13B may be set at 45°, for example.

Figure 15:
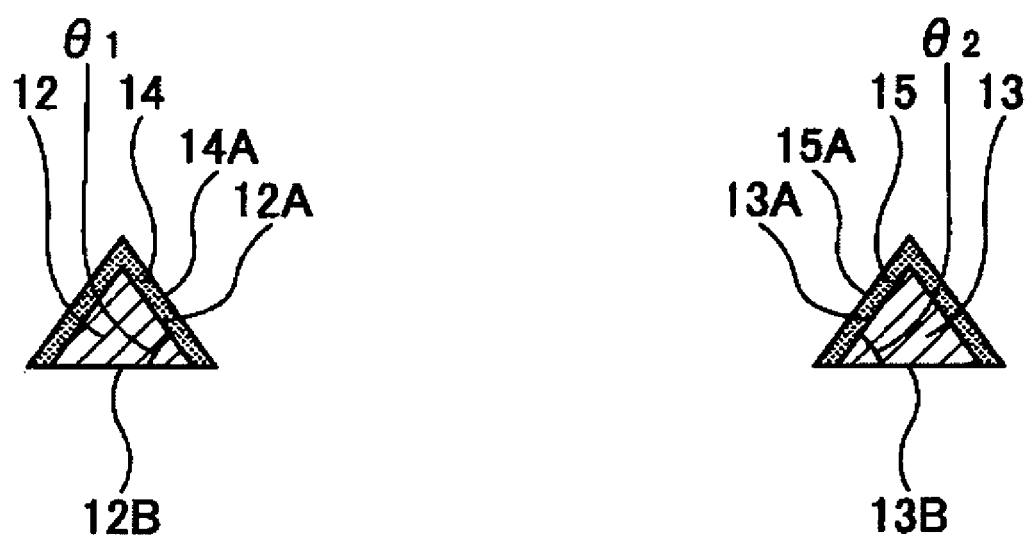
FIG. 15 is a view (#5) showing a manufacturing process of the optical/electrical hybrid substrate according to the first embodiment of the present invention.

Subsequently, in a step of FIG. 15, the mirrors 14 and 15 are formed by forming metal films on the smooth inclined surfaces 12A and 13A of the mirror supports 12 and 13, respectively (mirror forming step). The metal films as the mirrors 14 and 15 may be Au films, for example. Where the metal films are Au films, they may be formed by evaporation, for example. Where the metal films are Au films, the thickness of the mirrors 14 and 15 may be 0.2 to 1.0 μm, for example.

Figure 16:
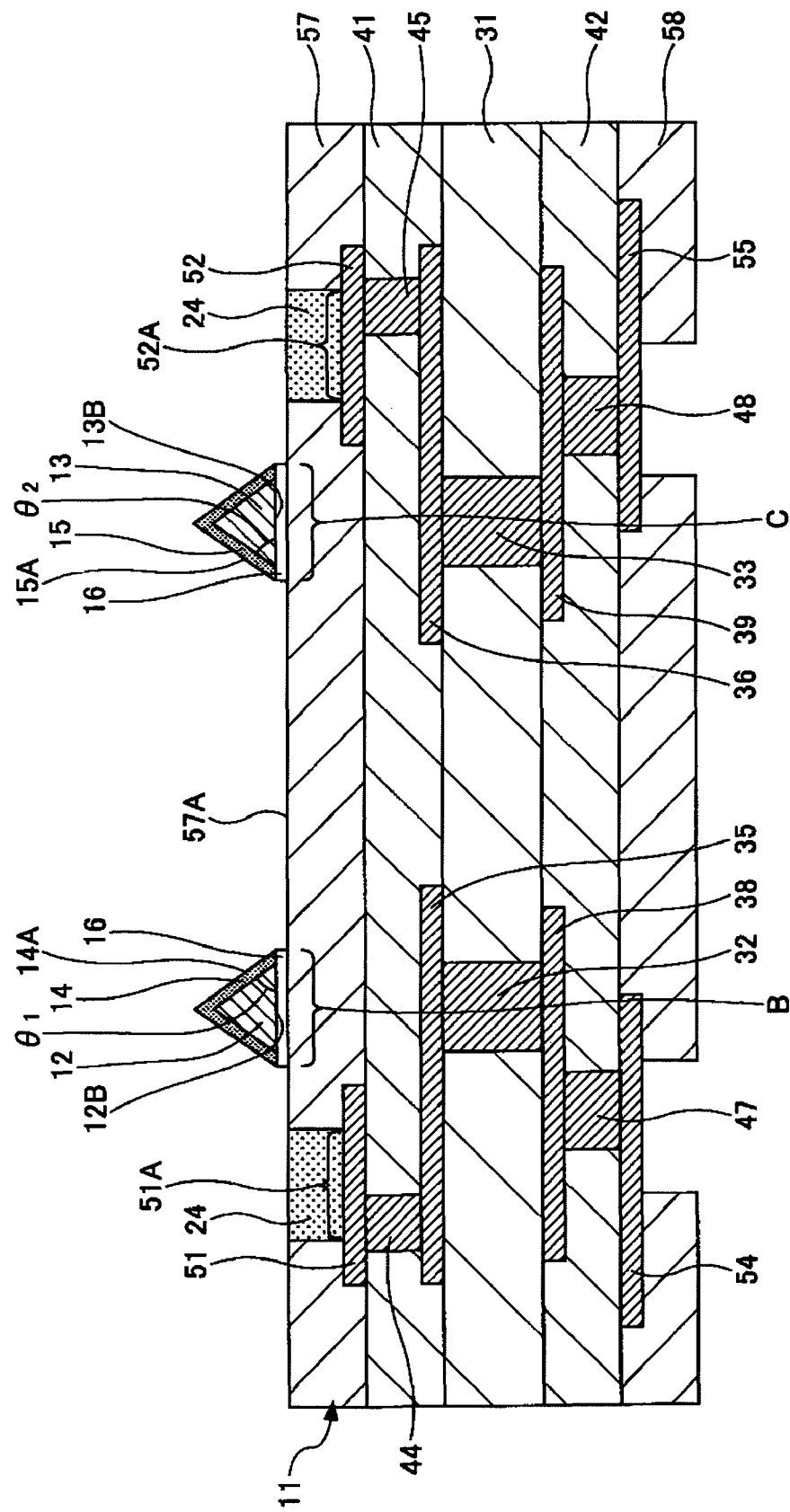
FIG. 16 is a view (#6) showing a manufacturing process of the optical/electrical hybrid substrate according to the first embodiment of the present invention.

Then, in a step of FIG. 16, the mirror support 12 (the structure shown in FIG. 15) on which the mirror 14 is formed is bonded, with an adhesive 16, onto that portion of the top surface 57A of the solder resist layer 57 which is located in the bonding area B. The mirror support 13 (the structure shown in FIG. 15) on which the mirror 15 is formed is bonded, with an adhesive 16, onto that portion of the top surface 57A of the solder resist layer 57 which is located in the bonding area C (mirror support bonding step).

Where the mirror supports 12 and 13 are made of silicon, the adhesives 16 may be made of a thermosetting resin, for example. In this case, the mirror supports 12 and 13 on which the mirrors 14 and 15 are formed are bonded to the solder resist layer 57 by heating the structure of FIG. 16.

Where the mirror supports 12 and 13 are made of glass, the adhesives 16 may be made of a ultraviolet-setting resin (specifically, an epoxy resin, an acrylic resin, or the like), for example. In this case, the mirror supports 12 and 13 on which the mirrors 14 and 15 are formed are bonded to the solder resist layer 57 by irradiating the adhesives 16 with ultraviolet light through those portions of the mirror supports 12 and 13 which are not formed with the mirrors 14 and 15, respectively.

Figure 17:
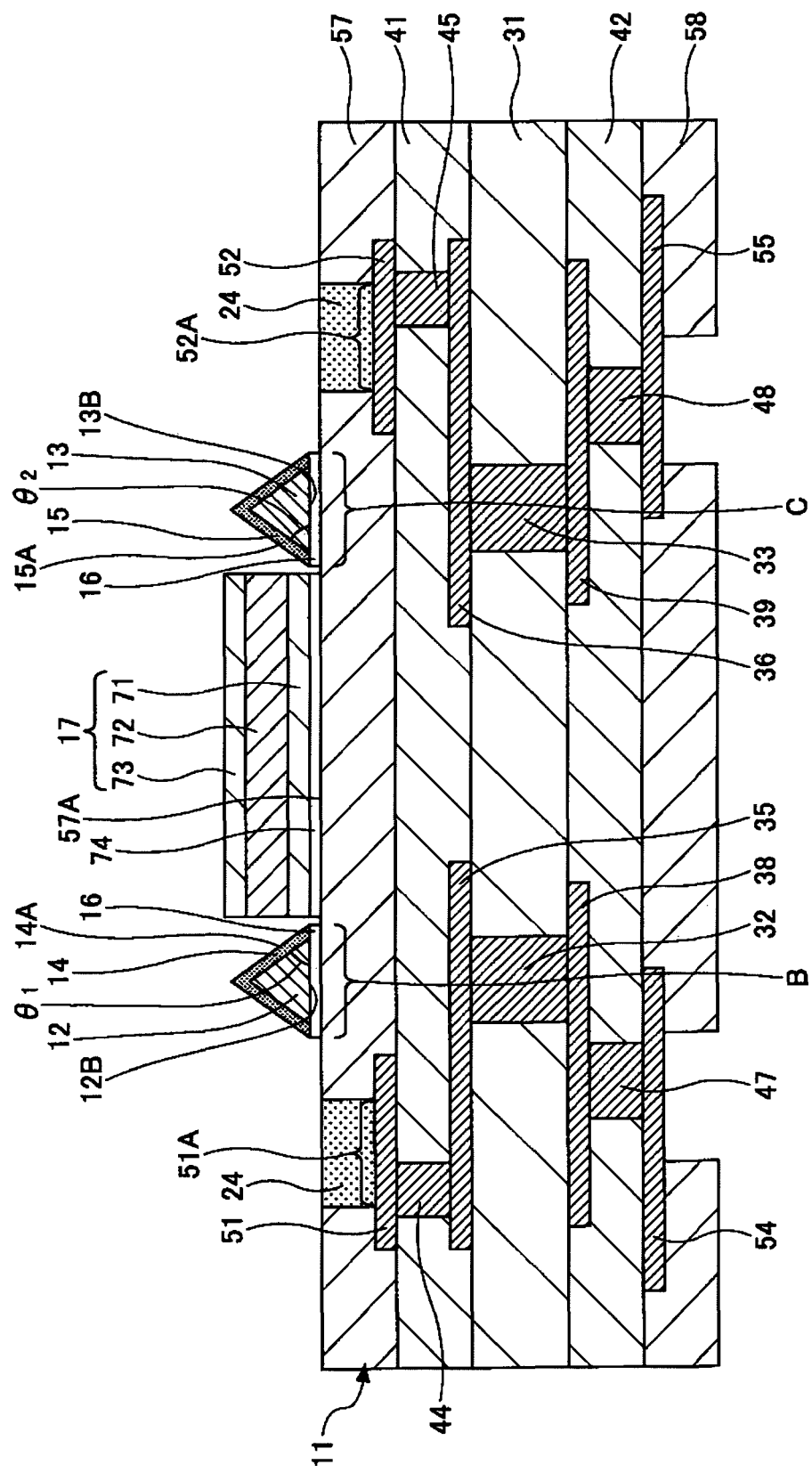
FIG. 17 is a view (#7) showing a manufacturing process of the optical/electrical hybrid substrate according to the first embodiment of the present invention.

Then, in a step of FIG. 17, the optical waveguide 17 is bonded to that portion of the top surface 57A of the solder resist layer 57 which is located between the bonding area B and C (optical waveguide bonding step). In this step, the optical waveguide 17 is bonded to the wiring substrate 11 so that the end faces of the core 72 of the optical waveguide 17 are opposed to the reflection surfaces 14A and 15A of the mirrors 14 and 15, respectively.

Figure 18:
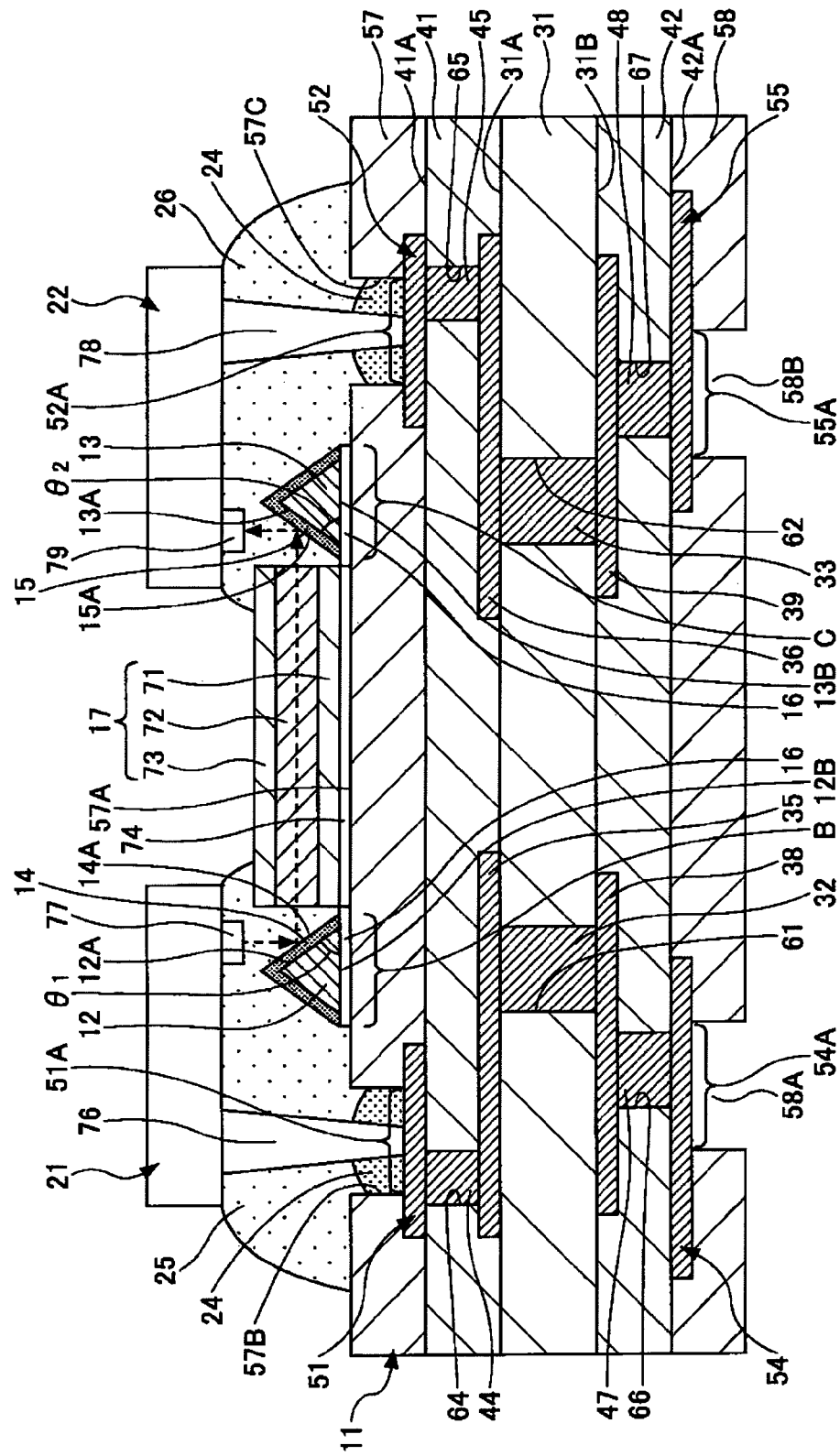
FIG. 18 is a view (#8) showing a manufacturing process of the optical/electrical hybrid substrate according to the first embodiment of the present invention.

Subsequently, in a step of FIG. 18, after the solders 24 are melted, a terminal 76 of a light-emitting element 21 is fixed to the connection portion 51A by bringing the former into contact with the latter and a terminal 78 of a light-receiving element 22 is fixed to the connection portion 52A by bringing the former into contact with the latter. Then, an underfill resin 25 is formed so as to fill the space between the light-emitting element 21 and each of the wiring substrate 11, the mirror 14, and the optical waveguide 17 and an underfill resin 26 is formed so as to fill the space between the light-receiving element 22 and each of the wiring substrate 11, the mirror 15, and the optical waveguide 17. It is advantageous that the underfill resins 25 and 26 be made of an optically transparent resin, for example. Specifically, the underfill resins 25 and 26 may be made of a silicone resin, for example.

In the optical/electrical hybrid substrate according to the exemplary embodiment, since the mirror supports 12 and 13 are formed in the step that is separate from the wiring substrate forming step and the optical waveguide forming step, the inclined surfaces 12A and 13A on which the mirrors 14 and 15 are formed can be made smooth surfaces. Furthermore, since the mirrors 14 and 15 are formed by forming metal films on the smooth inclined surfaces 12A and 13A of the mirror supports 12 and 13, the reflection surfaces 14A and 15A of the mirrors 14 and 15 for reflecting an optical signal can be made smooth surfaces. The transmission loss of an optical signal caused by the mirrors 14 and 15 can thus be reduced.

Second Embodiment

Figure 19:
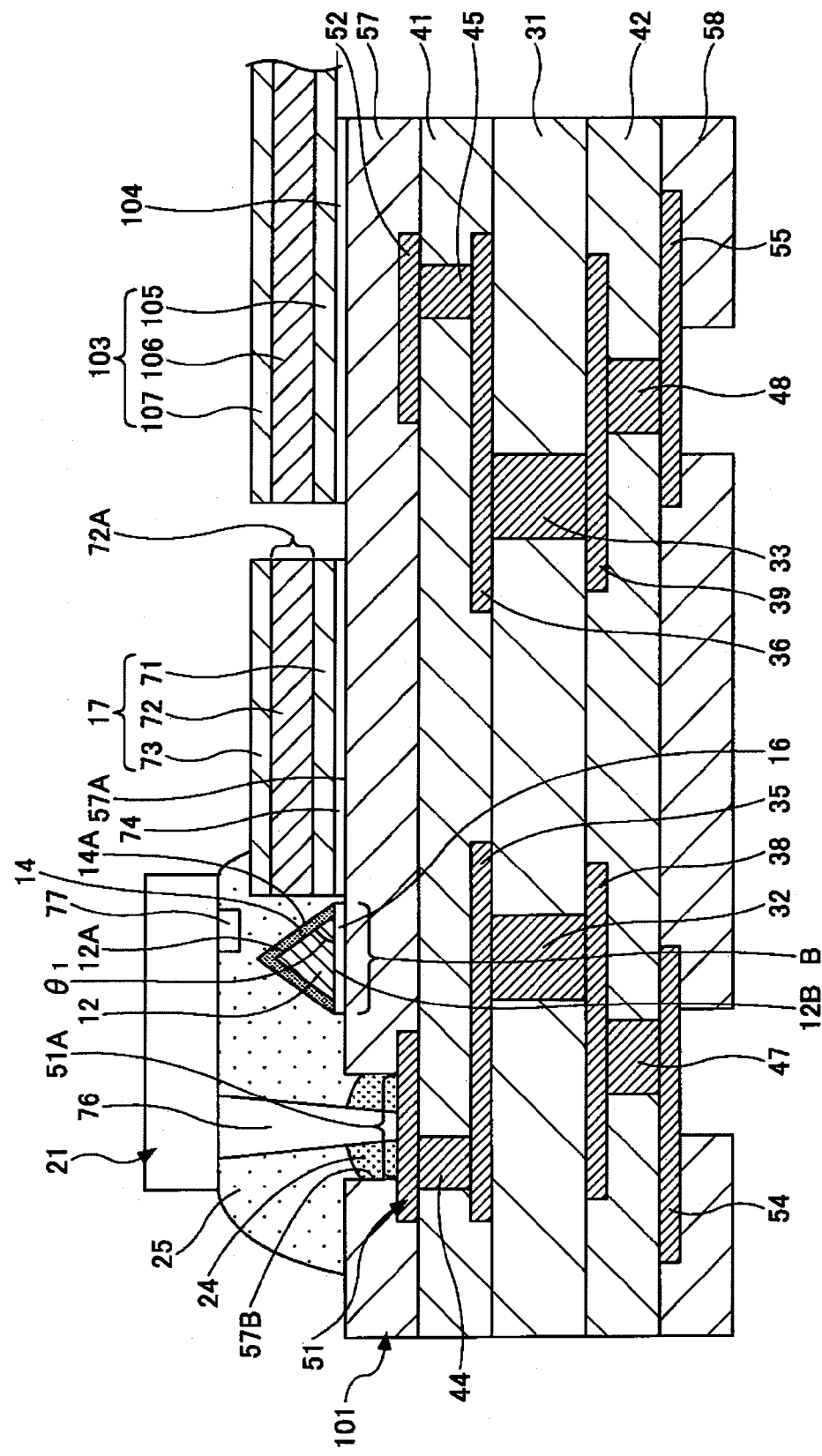
FIG. 19 is a sectional view of an optical/electrical hybrid substrate according to a second embodiment of the present invention.

FIG. 19 is a sectional view of an optical/electrical hybrid substrate according to a second embodiment of the present invention. In FIG. 19, components having the same components in the optical/electrical hybrid substrate 10 according to the first embodiment are given the same reference symbols as the latter.

Referring to FIG. 19, the optical/electrical hybrid substrate 100 according to the second embodiment includes a mirror support 12, a mirror 14, and an optical waveguide 17, a light emitting element 21, a solder 24, an underfill resin 25, a wiring substrate 101, and an optical fiber 103.

The wiring substrate 101 is configured in the same manner as the wiring substrate 11 described in the first embodiment except that the wiring substrate 101 is not provided with the opening 57C of the solder resist layer 57 and the solder 24 formed in the opening 57C that are provided in the wiring substrate 11.

The optical fiber 103 has a core 106 for transmitting an optical signal and a cladding layer 107 which covers the core 106. The optical fiber 103 is fixed to the top surface 57A of the solder resist layer 57 with an adhesive 104, and is disposed in such a manner that the end face of the core 106 is opposed to the end face (on the side where the core 72 is not opposed to the mirror 14) of the core 72 of the optical waveguide 17.

The optical/electrical hybrid substrate 100 according to the second embodiment having the above configuration provides the same advantages as the optical/electrical hybrid substrate 10 according to the first embodiment. The optical/electrical hybrid substrate 100 according to the second embodiment can be manufactured by a manufacturing method that is similar to the manufacturing method of the optical/electrical hybrid substrate 10 according to the first embodiment, and the manufacturing method of the optical/electrical hybrid substrate 100 provides the same advantages as that of the optical/electrical hybrid substrate 10.

Third Embodiment

Figure 20:
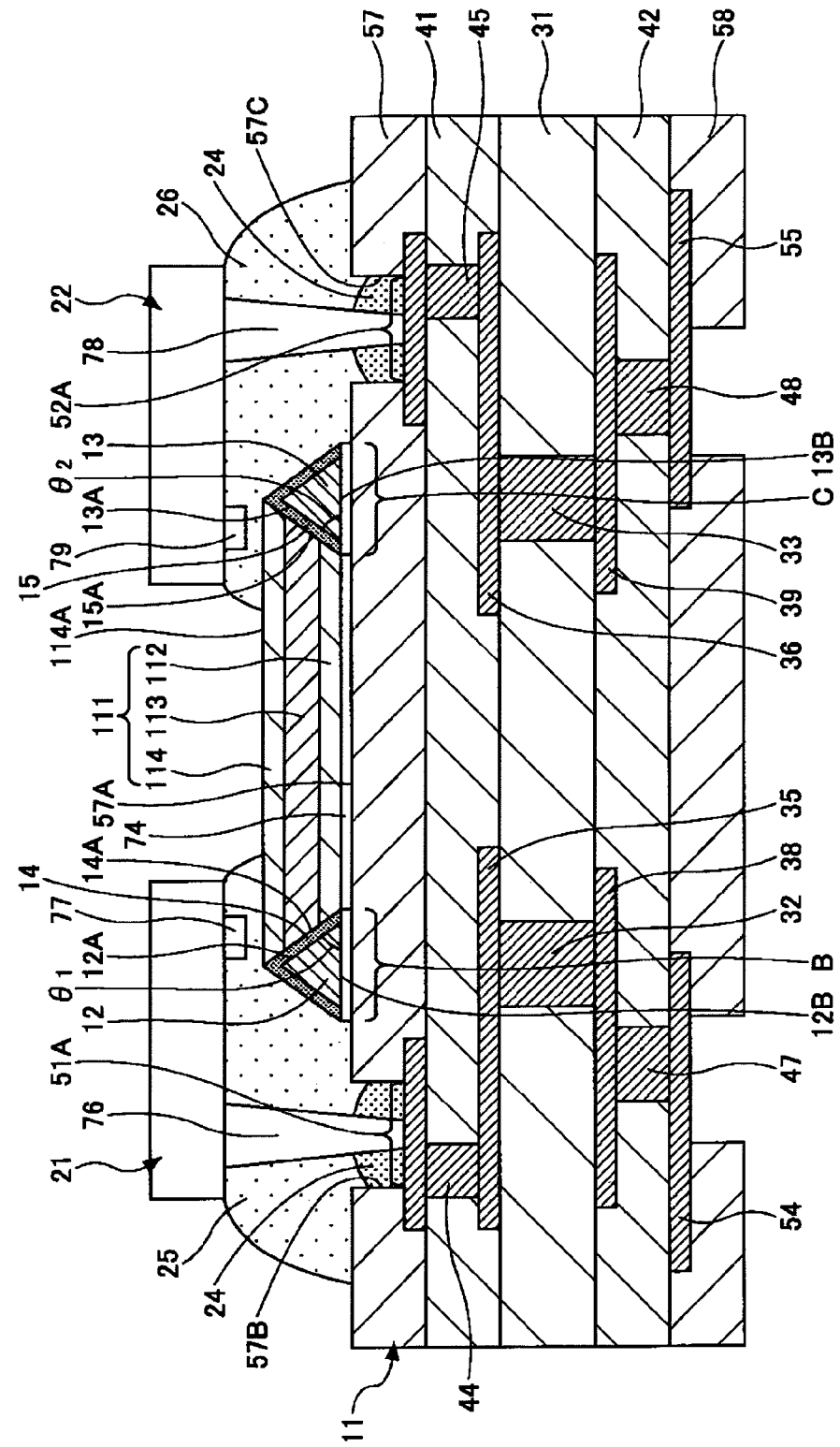
FIG. 20 is a sectional view of an optical/electrical hybrid substrate according to a third embodiment of the present invention.

FIG. 20 is a sectional view of an optical/electrical hybrid substrate according to a third embodiment of the present invention. In FIG. 20, components having the same components in the optical/electrical hybrid substrate 10 according to the first embodiment are given the same reference symbols as the latter.

Referring to FIG. 20, the optical/electrical hybrid substrate 110 according to the third embodiment is configured in the same manner as the optical/electrical hybrid substrate 10 according to the first embodiment except that an optical waveguide 111 is used instead of the optical waveguide 17 that is provided in the optical/electrical hybrid substrate 10.

The optical waveguide 111 includes a first cladding layer 112, a core 113 which is formed on the first cladding layer 112, and a second cladding layer 114 which is formed over the first cladding layer 112 so as to cover the core 113. The optical waveguide 111 is bonded, with an adhesive 74, onto that portion of the top surface 57A of the solder resist layer 57 which is located between the mirrors 14 and 15.

The optical waveguide 111 has two end faces that are opposed to the respective mirrors 14 and 15. The two end faces of the optical waveguide 111 are inclined surfaces. One inclined surface of the optical waveguide 111 is in contact with the mirror 14 and the other inclined surface is in contact with the mirror 15. The angle $\theta_3$ formed by the one inclined surface of the optical waveguide 111 and a top surface 114A of the second cladding layer 114 is approximately equal to the angle $\theta_1$ between the inclined surface 12A of the mirror support 12 and the top surface 57A of the solder resist layer 57. Where the angle $\theta_1$ is 45°, for example, the angle $\theta_3$ is also set equal to 45°. The angle $\theta_4$ formed by the other inclined surface of the optical waveguide 111 and the top surface 114A of the second cladding layer 114 is approximately equal to the angle $\theta_2$ between the inclined surface 13A of the mirror support 13 and the top surface 57A of the solder resist layer 57. Where the angle $\theta_2$ is 45°, for example, the angle $\theta_4$ is also set equal to 45°.

The optical/electrical hybrid substrate 110 according to the third embodiment having the above configuration provides the same advantages as the optical/electrical hybrid substrate 10 according to the first embodiment. The optical/electrical hybrid substrate 110 according to the third embodiment can be manufactured by a manufacturing method that is similar to the manufacturing method of the optical/electrical hybrid substrate 10 according to the first embodiment, and the manufacturing method of the optical/electrical hybrid substrate 110 provides the same advantages as that of the optical/electrical hybrid substrate 10.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention. For example, each of the wiring substrate 11 and 101 may be a coreless board.

What is claimed is:

1. An optical/electrical hybrid device comprising:
a wiring substrate comprising a plurality of wiring layers, a plurality of insulating layers and a plurality of through vias, wherein the plurality of wiring layers and the plurality of insulating layers are alternately disposed, and the plurality of wiring layers are electrically connected to each other via the plurality of through vias;
an optical waveguide disposed on the wiring substrate and configured to transmit an optical signal;
a mirror support bonded directly onto the wiring substrate with an adhesive and being made of glass or silicon;
a mirror which reflects the optical signal and which is formed on an inclined surface of the mirror support;
an underfill resin formed to fill a space between the mirror and the optical waveguide; and
at least one of a light-emitting element and a light-receiving element disposed over the mirror,
wherein the optical waveguide is opposed to a reflection surface of the mirror which reflects the optical signal.

2. The optical/electrical hybrid device according to claim 1, wherein the adhesive is a thermosetting resin or an ultraviolet-setting resin.

3. The optical/electrical hybrid device according to claim 1, wherein an angle between the inclined surface and a surface of the wiring substrate onto which the mirror support is bonded is about 45 degree.

4. The optical/electrical hybrid device according to claim 1, wherein the mirror is formed to entirely cover the inclined surface of the mirror support.

5. The optical/electrical hybrid device according to claim 1, wherein the inclined surface of the mirror support inclines the mirror to reflect the optical signal between over the mirror and toward a core of the optical waveguide.

6. A method of manufacturing an optical/electrical hybrid device, the method comprising:
(a) forming a wiring substrate comprising a plurality of wiring layers, a plurality of insulating layers and a plurality of through vias, wherein the plurality of wiring layers and the plurality of insulating layers are alternately disposed, and the plurality of wiring layers are electrically connected to each other via the plurality of through vias;
(b) forming an optical waveguide;
(c) forming a mirror support having an inclined surface;
(d) forming a mirror on the inclined surface of the mirror support;
(e) bonding the mirror support formed with the mirror directly onto the wiring substrate with an adhesive;
(f) bonding the optical waveguide to the wiring substrate such that the optical waveguide is opposed to a reflection surface of the mirror which reflects an optical signal;
(g) forming an underfill resin to fill a space between the mirror and the optical waveguide; and
(h) disposing at least one of a light-emitting element and a light-receiving element over the mirror.

7. The method according to claim 6, wherein the mirror support is made of glass and the adhesive is an ultraviolet-setting resin,
wherein step (e) comprises: bonding the mirror support onto the wiring substrate by irradiating the adhesive with ultraviolet light.

8. The method according to claim 6, wherein an angle between the inclined surface and a surface of the wiring substrate onto which the mirror support is bonded is about 45 degree.

9. The method according to claim 6, wherein step (d) comprises:
forming the mirror to entirely cover the inclined surface of the mirror support.

10. The method according to claim 6, wherein step (d) comprises: forming a mirror on the inclined surface of the mirror support such that the mirror is inclined to reflect an optical signal between over the mirror and toward a core of the optical waveguide.

* * * * *